(12) United States Patent
Terasaki et al.

(10) Patent No.: US 7,960,090 B2
(45) Date of Patent: Jun. 14, 2011

(54) PATTERN FORMING METHOD, PATTERN FORMED THEREBY, MOLD, PROCESSING APPARATUS, AND PROCESSING METHOD

(75) Inventors: Atsunori Terasaki, Kawasaki (JP); Junichi Seki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 458 days.

(21) Appl. No.: 12/124,492

(22) Filed: May 21, 2008

(65) Prior Publication Data

US 2008/0292976 A1    Nov. 27, 2008

(30) Foreign Application Priority Data

May 23, 2007    (JP) .................................. 2007-137234

(51) Int. Cl.
    *G03F 7/00*      (2006.01)
    *G03F 7/20*      (2006.01)
    *G03F 7/26*      (2006.01)
    *G03F 7/40*      (2006.01)

(52) U.S. Cl. .................. 430/270.1; 430/311; 430/273.1; 430/312; 430/317; 430/318; 430/322; 430/331

(58) Field of Classification Search ............... 430/270.1, 430/311, 273.1, 312, 317, 318, 322, 331
See application file for complete search history.

(56) References Cited

U.S. PATENT DOCUMENTS

| | | | | |
|---|---|---|---|---|
| 4,520,097 A * | 5/1985 | Oguchi | ....................... | 430/280.1 |
| 5,529,681 A | 6/1996 | Reinecke et al. | ............... | 205/70 |
| 5,930,672 A | 7/1999 | Yamamoto | .................... | 438/637 |
| 6,194,268 B1 | 2/2001 | Furukawa et al. | ............ | 438/257 |
| 6,221,562 B1 * | 4/2001 | Boyd et al. | ..................... | 430/314 |
| 6,420,088 B1 * | 7/2002 | Angelopoulos et al. | ... | 430/272.1 |
| 6,580,172 B2 * | 6/2003 | Mancini et al. | ............... | 257/762 |
| 6,900,134 B1 | 5/2005 | Shih et al. | ...................... | 438/702 |
| 2006/0063112 A1 | 3/2006 | Sreenivasan | .................. | 430/322 |
| 2007/0145639 A1 | 6/2007 | Seki et al. | ...................... | 264/293 |
| 2008/0047932 A1 | 2/2008 | Terasaki et al. | ................. | 216/41 |

(Continued)

FOREIGN PATENT DOCUMENTS

EP      1 333 324 A2    8/2003

(Continued)

OTHER PUBLICATIONS

H. Watanabe et al., "Submicron Feature Patterning Using Spin-On-Glass Image Reversal (SOGIR)," Journal of the Electrochemical Society, vol. 135, No. 11, pp. 2863-2866, Nov. 1988.

(Continued)

*Primary Examiner* — Amanda C. Walke
(74) *Attorney, Agent, or Firm* — Fitzpatrick, Cella, Harper & Scinto

(57) ABSTRACT

A pattern forming method includes a step of forming a pattern of a resist on a surface of a thin film formed on the base material; a step of forming a reverse layer on the pattern of the resist; a step of forming a reverse pattern, of the reverse layer complementary to the pattern of the resist by removing the resist after removing the reverse layer to expose a surface of the resist; a step of forming a hard mask layer including the thin film, on which the reverse layer is formed, by etching the thin film through the reverse pattern of the reverse layer as a mask; and a step of etching the base material through, as a mask, the hard mask layer on which the reverse layer remains or the hard mask layer on which the reverse layer has been removed.

8 Claims, 7 Drawing Sheets

U.S. PATENT DOCUMENTS

| | | | |
|---|---|---|---|
| 2008/0166665 A1* | 7/2008 | Jung | 430/313 |
| 2008/0211133 A1 | 9/2008 | Terasaki et al. | 264/219 |
| 2010/0040838 A1* | 2/2010 | Abdallah et al. | 428/195.1 |

FOREIGN PATENT DOCUMENTS

| | | |
|---|---|---|
| EP | 1 860 501 A2 | 11/2007 |
| JP | 62-241338 | 10/1987 |
| JP | 5-346658 | 12/1993 |
| JP | 9-312336 | 12/1997 |

OTHER PUBLICATIONS

Chou, S. et., "Imprint of sub-25 nm vias and trenches in polymers", Appl. Phys. Lett. 67 (21), Nov. 20, 1995, pp. 3114-3116.

Thompson, E. et al., "Fabrication of Step and Flash™ Imprint Lithography Templates Using Commercial Mask Processes", Proc. of SPIE, vol. 5037 (2003), pp. 1019-1027.

Chou, S. et al., "Sub-10 nm imprint lithography and applications", J. Vac. Sci. Technol. B 15(6), Nov./Dec. 1997, pp. 2897-2904.

* cited by examiner (a)

(b)

(c)

(a)

(b)

(c)

(a)

(b)

(a)

(b)

(c)

(a)

(b)

PATTERN FORMING METHOD, PATTERN FORMED THEREBY, MOLD, PROCESSING APPARATUS, AND PROCESSING METHOD

FIELD OF THE INVENTION AND RELATED ART

The present invention relates to a pattern forming method, a pattern formed by the pattern forming method, a mold, a processing apparatus, and a processing method.

In recent years, a fine processing technology for transferring a fine structure provided on a mold onto a member to be processed such as a resin material, a metallic material, or the like has been developed and has received attention. This technology is called nanoimprint or nanoembossing and provides processing resolving power on the order of several nanometers. For this reason, the technology is expected to be applied to a next-generation semiconductor manufacturing technology in place of a light exposure device such as a stepper, a scanner, or the like. Further, the technology is capable of effecting simultaneous processing of a three-dimensional structure at a wafer level. For this reason, the technology is expected to be applied to a wide variety of fields such as manufacturing technologies and the like for optical devices such as photonic crystal and the like, biochips such as μ-TAS (micro total analysis system), etc.

In the case where such processing using imprint is applied to the semiconductor manufacturing technology, e.g., as described in Stephan Y. Chou et al., Appl. Phys. Lett., Vol. 67, Issue 21, pp. 3114-3316 (1995) ("Document 1"), the processing is performed in the following manner.

That is, with respect to a work (workpiece) including a substrate (e.g., a semiconductor wafer) and a photocurable resin material disposed on the substrate, a mold provided with a desired imprint pattern is abutted and pressed against the photocurable resin material, followed by ultraviolet irradiation to cure the photocurable resin material ("optical imprint") Alternatively, a thermoplastic resin material is formed on the substrate and heated to be softened. Then, the mold is abutted and pressed against the softened resin material, followed by temperature lowering thereby to harden the resin material ("thermal imprint"). As a result, the imprint pattern is transferred onto the resin material layer. The resultant resin material layer is used as it is, or with the resin material layer as a mask layer, etching or the like is performed to form a pattern onto the substrate.

In such an imprint technology, precision of a transfer shape depends on processing precision of the mold.

As a material for the mold, e.g., in the optical imprint, a transparent material such as quartz is used. It is very technically difficult to process quartz on the order of submicrons by etching through a resist mask. This is because the etching of $SiO_2$ generally requires very high ion energy when compared with the case of other materials, so that a load on the resist mask is very large.

In order to solve this problem, it is required to take measures such that a material resistive to impact of high ion energy, that a pattern image is formed in a sufficient thickness, and that an etching condition for suppressing consumption of the resist is established, singly or in combination.

For that reason, in a conventional imprint technology, a metal material such as Cr or the like has generally been used in many cases.

For example, in Ecron Thompson, Peter Rhyins, Ron Voisin, s. V. Sreenivasan, Patrick Martin. SPIE Microlithography Conference, February 2003 ("Document 2"), a pattern forming method using the metal material as a hard mask as shown in FIGS. 3(a) to 3(c) has been disclosed. In this pattern forming method, first, a thin hard mask layer 302 is formed of the metal material on a base material 301 and a resist 303 is formed on the hard mask layer 302 and is subjected to pattern (FIG. 3(a)). Next, etching is performed by using the resist 303 as a mask to transfer a resist pattern onto the thin hard mask layer 302 of the metal material (FIG. 3(b)). Then, the base material 301 is etched by using the hard mask layer 302 as a mask (FIG. 3(c)).

Further, a method of preparing a mask with a processing dimension of less than 28 nm by a lift off method has been studied, e.g., as described in Stephen y. Chou, Peter R. Krauss, Wei Zhang, Lingjie Guo, and Lei Zhuang J. VAC. Sci. Technol. b. 15, 2897 (1997) ("Document 3"). This method is shown in FIGS. 5(a) and 5(b). First, a resist 502 is formed on a base material 501 and subjected to patterning. On the surface of the resist 502, a hard mask layer 503 is formed of a desired material by a method such as vapor deposition or chemical vapor deposition (CVD) (FIG. 5(a)). Then, by dissolving the resist 502, the hard mask layer 503 is left only at an opening portion of the resist 502 (FIG. 5(b)). The base material 501 is etched by using the hard mask layer 503 as a mask similarly as in the step of FIG. 3(c).

However, in the above-described method of Document 2 using the metal material such as Cr as the hard mask, there can arise the following problem during fine processing on the order of 100 nm or less.

In the fine processing on the order of 100 nm or less, a decrease in thickness of the resist and a weakening of a material are noticeable. For that reason, the resist disappears during processing with the hard mask in some cases. Further, even in the case where the resist has a sufficient thickness and does not disappear during the processing, as shown in FIGS. 4(a) to 4(c), the base material is deformed due to damage by plasma during dry etching.

FIG. 4(a) is a perspective view of FIG. 3(a), in which the hard mask layer 302 and the resist 303 are formed on the base material 301.

When the hard mask layer 302 is etched by using the resist 303 as a mask, the resist 303 is deformed in an unintended shape (FIG. 4(b)).

As a result, roughness of the pattern of the resist 303 is transferred onto the hard mask layer 302. By subsequent etching, the roughness is further transferred onto the base material 301 (FIG. 4(c)).

Due to these factors, it is difficult to satisfy critical dimension (CD) accuracy and low edge line roughness (ELR).

Further, according to the lift-off method described in Document 3, it is possible to effect the processing with the processing precision of less than 28 nm. However, there can arise problems as shown in FIGS. 6(a) to 6(c).

That is, such a problem that a hard mask material deposited on the resist surface is connected to an adjacent pattern portion due to removal failure is caused to occur (FIG. 6(a)).

Further, there arises such a problem that a burr is left at a pattern edge (FIG. 6(b)).

Further, there arises such a problem that a sufficient thickness cannot be ensured at the pattern edge (FIG. 6(c)).

Due to these problems, in the lift-off method, it is difficult to obtain a yield capable of meeting mass production.

SUMMARY OF THE INVENTION

A principal object of the present invention is to provide a pattern forming method which has solved the above-described problems and is capable of forming a pattern without using a resist as an etching mask and without using a lift-off method.

Another object of the present invention is to provide a pattern formed by the pattern forming method.

A further object of the present invention is to provide a mold having the pattern, a processing apparatus using the mold, and a processing process using the mold.

According to an aspect of the present invention, there is provided a pattern forming method comprising:

a step of forming a thin film, on a surface of a base material of a first material, of a second material;

a step of forming a pattern of a resist on a surface of the thin film of the second material;

a step of forming a reverse layer of a third material on the pattern of the resist;

a step of removing the reverse layer to expose a surface of the resist;

a step of forming a reverse pattern, of the reverse layer complementary to the pattern of the resist by removing the resist;

a step of forming a hard mask layer comprising the thin film, on which the reverse layer is formed, by etching the thin film through the reverse pattern of the reverse layer as a mask; and a step of etching the base material through, as a mask, the hard mask layer on which the reverse layer remains or the hard mask layer on which the reverse layer has been removed.

According to another aspect of the present invention, there are provided a pattern formed by the pattern forming method, a mold having the pattern, a processing apparatus using the mold, and a processing process using the mold.

According to the present invention, it is possible to realize a pattern forming method capable of forming a pattern without using the resist as the mask and without using the lift-off method. It is also possible to realize a pattern formed by the pattern forming method, a mask having the pattern, a processing apparatus using the mold, and a processing process using the mold.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Figure 1:
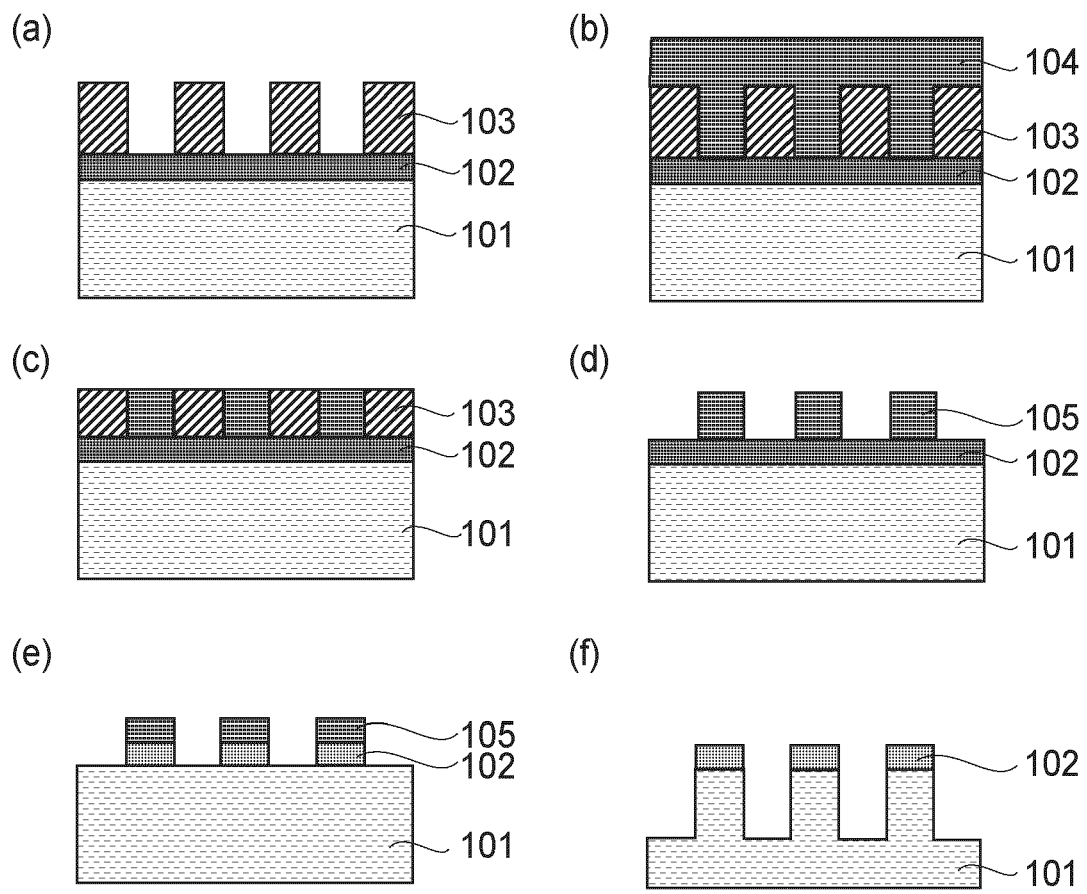
FIGS. 1(a) to 1(f) are sectional views for illustrating a pattern forming method as an embodiment of the present invention.

According to the above-described constitution, it is possible to suppress disappearing of the resist during processing with the hard mask and an occurrence of deformation of the resist due to damage by plasma during dry etching. Further, pattern formation can be performed without using the lift-off method.

More specifically, these can be achieved by a pattern forming method as an embodiment of the present invention below.

In the pattern forming method, first, on a surface of a pattern of a resist formed on a thin film for forming a hard mask provided on a base material, a layer of a robust material which is capable of providing etch selection ratios thereof with the resist and the thin film for forming the hard mask and which has high resistance to plasma is used as a reverse layer.

Next, the reverse layer is removed until a surface of the resist pattern is exposed and thereafter only the resist is selectively removed. Thus, a reverse pattern complementary to the resist pattern is formed.

By using this reverse pattern as a mask, the thin film for forming the hard mask formed in the base material is etched to form a hard mask layer.

Next, the base material is etched by using the hard mask layer as a mask to form a pattern.

Thus, it is possible to form the pattern without using the resist as an etching mask during etching of the base material and without using the lift-off method.

Therefore, different from the conventional pattern forming methods, it is possible to alleviate a deterioration (deformation) of a shape when a pattern shape is transferred onto the hard mask during lithography.

Embodiments

Hereinbelow, a pattern forming method of an embodiment according to the present invention will be described with reference to FIGS. 1(a) to 1(f) which are sectional views for illustrating the pattern forming method.

Referring to FIGS. 1(a) to 1(f), the pattern forming method of third embodiment is performed through steps below by using a base material 101, a thin film 102 for forming a hard mask, a resist 103, a reverse layer 104, and a reverse pattern 105.

(1) Step of Forming a Thin Film of a Second Material on a Surface of a Base Material of a First Material First, on the surface of the base material 101, the thin film 102 of the second material for forming the hard mask is formed. The thin film 102 for forming the hard mask may be formed by appropriately selecting a method from vapor deposition, CVD, spin coating, etc.

Next, on the thin film 102 for forming the hard mask, the resist pattern 103 is formed (FIG. 1(a)). Examples of a pattern method of the resist 103 may include light exposure using a stepper, a scanner, or the like, and lithography with an electron beam.

(2) Step of Forming the Resist Pattern on the Surface of the Thin Film of the Second Material and Forming a Reverse Layer of a Third Material on the Resist Pattern On the resist 103, the reverse layer 104 is formed of the third material. As a result, the resist pattern 103 is completely buried in the reverse layer 104 (FIG. 1(b)). A method of forming the reverse layer 104 is appropriately selected from methods such as spin coating, vapor deposition, and CVD.

After the step of forming the reverse layer 104, the reverse layer 104 may desirably be flattened. For this purpose, it is possible to employ spin coating which provides a flattened surface to some extent during film formation. Further, it is possible to flatten the film surface after the film formation through, e.g., chemical mechanical polishing (CMP). A flattening processing such as the CMP may also be performed after the spin coating.

(3) Step of Removing the Reverse Layer Until the Surface of the Resist is Exposed The reverse layer 104 is removed until an upper surface of the resist 103 is exposed (FIG. 1(c)). This step may be performed by etch back through dry etching or the flattening processing such as the CMP. It is also possible to continue the flattening processing in the Step (2) (FIG. 1(b)) until the state shown in FIG. 1(c) is obtained.

(4) Step of Forming a Reverse Pattern of the Reverse Layer Complementary to the Resist Pattern by Removing the Resist The resist 103 is removed. By this, the reverse pattern 105 is formed in such a manner that opening portions of the resist pattern 103 (FIG. 1(a)) are replaced with the reverse layer 104 (FIG. 1(d)).

The removal of the resist 103 is performed by etching/ashing using a parting (releasing) liquid or plasma.

(5) Step of Forming a Hard Mask Layer Comprising the Thin Film, on which the Reverse Layer is Formed, by Etching the Thin Film Through the Reverse Pattern of the Reverse Layer as a Mask The hard mask layer is formed by etching the thin film 102 for forming the hard mask through the reverse pattern 105 as a mask (FIG. 1(e)).

(6) Step of Etching the Base Material of the First Material Through, as a Mask, the Hard Mask Layer of the Thin Film on which the Reverse Layer Remains or the Hard Mask Layer on which the Reverse Layer has Been Removed.

By using a combination of the reverse pattern 105 and the hard mask 102 as the mask or using the hard mask 102 on which the reverse pattern 105 has been removed as the mask, the base material 101 is etched (FIG. 1(f)). After the etching, the reverse pattern 105 and/or the hard mask layer 102 may be removed as desired.

In this embodiment, the reverse layer 104 can be formed of a material excellent in resistance to plasma compared with that for the resist 103.

Accordingly, it is possible to prevent a lowering in dimension control property due to an insufficient thickness of a mask and a deterioration in shape due to deformation of a mask pattern, which have been problematic during etching of the thin film 102 of the second material for forming the hard mask.

Further, in patterning of the resist in a fine pattern, such a phenomenon that adjacent pattern portions are attracted to each other by surface tension during drying of a developing liquid or a rinsing liquid to fall down (pattern falling) can occur. This phenomenon is more liable to occur with an increasing thickness of the resist relative to a pattern width.

However, by using the pattern forming method of this embodiment, it is possible to reduce a degree of the occurrence of the pattern falling. This is because the reverse layer 104 functions as the mask during the etching with a thickness smaller than that of the resist, so that the thickness of the resist can be decreased compared with the case of the conventional process even with the same processing dimension.

A typical combination of the base material 101 and the thin film 102 for forming the hard mask is quartz (for base material 101) and Cr (for thin film 102). However, in this embodiment, the combination is not particularly limited to quartz and Cr but may be appropriately be selected from any combinations so long as materials for the combination can ensure a proper etching selection ratio therebetween.

For example, as the material for the base material 101, it is possible to use a transparent material such as $TiO_2$, $Al_2O_3$, ZnO, ITO (indium tin oxide), $CaF_2$ or SiN; silicon; silicon oxide compounds; ordinary metal materials; and so on.

As the material for the thin film 102, it is possible to select Al, WSi, Ni, Cr or the like so that the selected material can provide a proper etching selection ratio in combination with the material for the base material 101.

As the material for the reverse layer 104, it is possible to use silicon-based materials such as $SiO_2$, SiN, silicon oxide compounds; resin-based compounds containing silicon; insulating materials such as $TiO_2$ and $Al_2O_3$; and ordinary metal materials. From these materials, it is possible to select a material capable of providing a proper etching selection ratio with respect to the material for the thin film 102 for forming the hard mask.

For example, as a method of forming a reverse layer of SiO2, it is possible to employ spin coating with spin on glass (SOG) containing silicon oxide or film formation by plasma CVD with tetra ethyl ortho silicate (TEOS).

The process in this embodiment is more suitable for the case where an area other than an area in which the hard mask layer is used as the mask in the step of etching the base material is 50% or more of an area of the entire surface of the base material.

Figure 7:
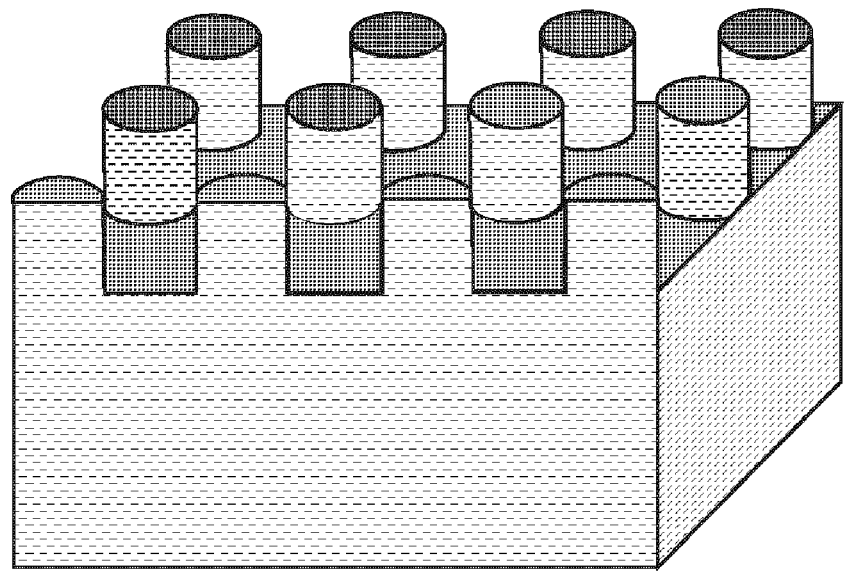
FIGS. 7(a) and 7(b) are perspective views for illustrating patterns formed by a pattern forming method in an embodiment of the present invention.
Figure 7:
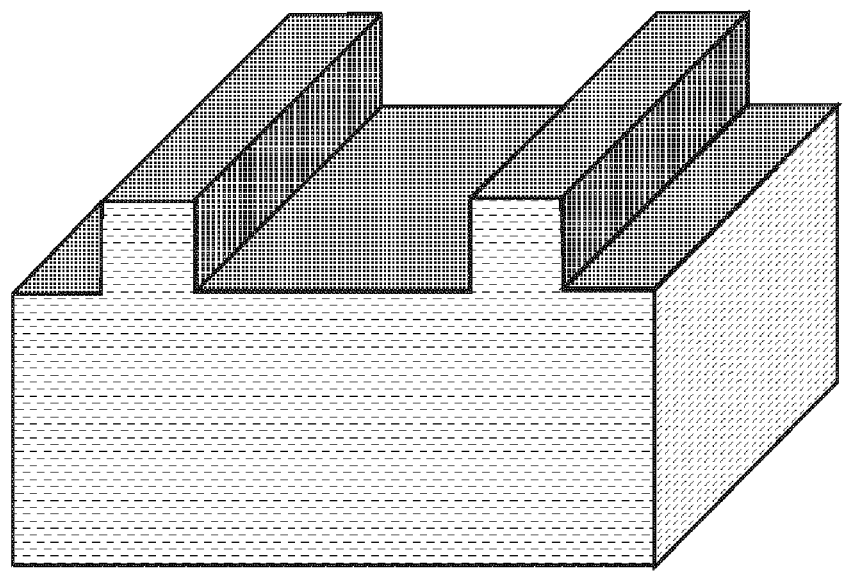

Examples of a resultant pattern may preferably include a dot pattern as shown in FIG. 7(a) and an isolated line pattern as shown in FIG. 7(b). It is also possible to include a pattern constituted by a combination of the dot pattern and the isolated line pattern.

In a conventional lithography technology, most of resists with high resolutions are so-called positive resists in which an exposed portion is removed during development. In the case of forming the above-described pattern with a positive resist, exposure is performed so as to surround the pattern, so that an amount of removed portion is increased. For this reason, it is very difficult to effect dimension control.

Further, even in electron beam (direct) drawing or photolithography, during preparation of a mask, a large area surrounding (adjacent to) a pattern is exposed, so that it takes a long time and a large cost.

In the present invention, e.g., dot pattern formation only requires hole pattern drawing. This leads to not only easy dimension control but also considerable reduction in process time.

In the case where the area other than the area in which the hard mask layer is used as the mask in the step of etching the base material is less than 50% of the area of the entire surface of the base material, the pattern forming method shown in FIGS. 1(a) to 1(f) is not always suitable in some cases. That is, 50% or more of the area of the entire surface of the base material is subjected to drawing, thus resulting in disadvantages in terms of the dimension control and the process time. In this case, a pattern forming method shown in FIGS. 2(a) to 2(i) different from that shown in FIGS. 1(a) to 1(f) is effective.

Hereinbelow, another embodiment of the pattern forming method of the present invention will be described with reference to FIGS. 2(a) to 2(i).

(1) Step of Forming a Pattern of a Resist on a Transfer Layer Provided a Thin Film of a Second Material Provided on a Surface of a Base Material of a First Material First, on the surface of the base material 101, the thin film 102 of the second material for forming the hard mask is formed.

Figure 2:
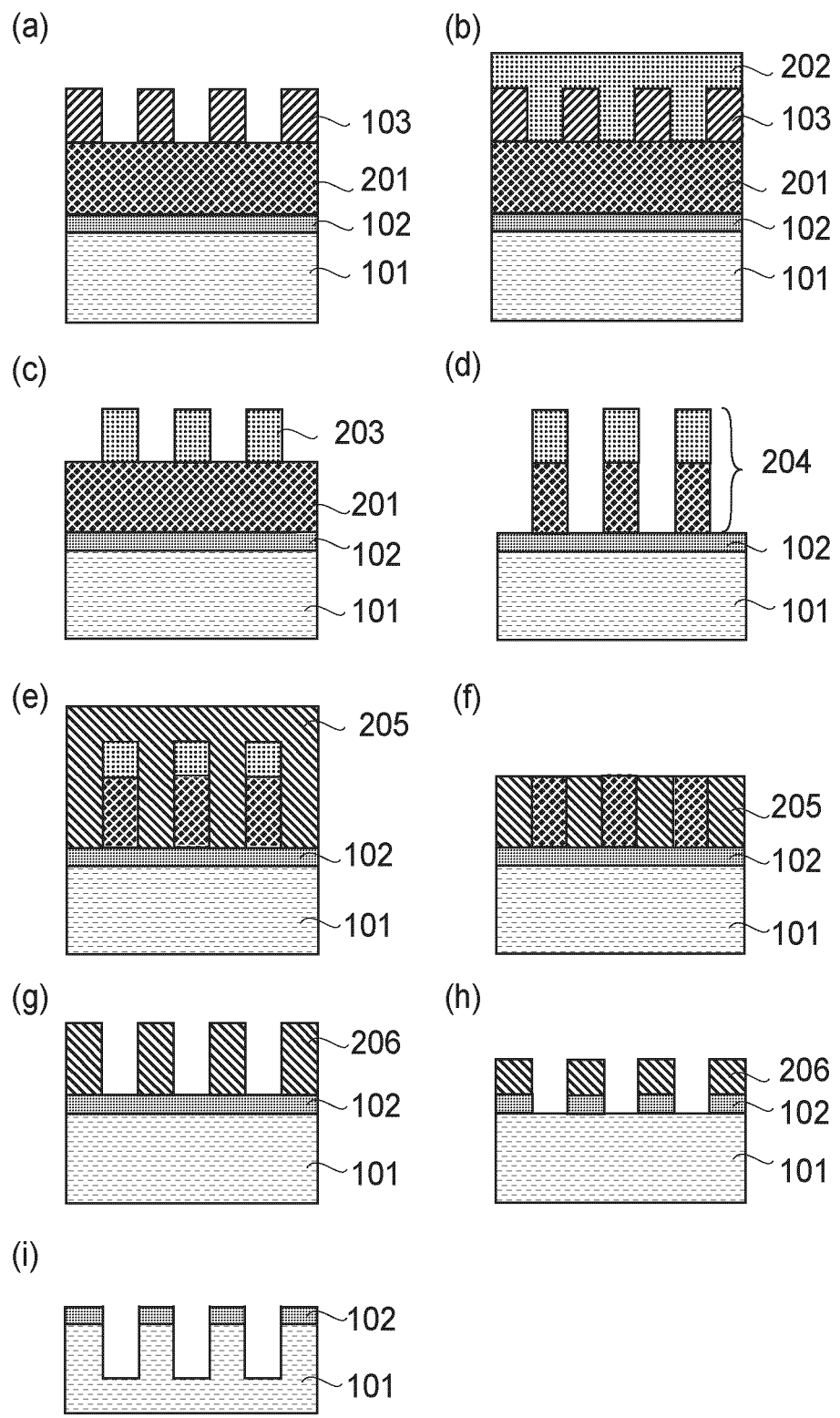
FIGS. 2(a) to 2(i) are sectional views for illustrating a pattern forming method as another embodiment of the present invention.
Figure 3:
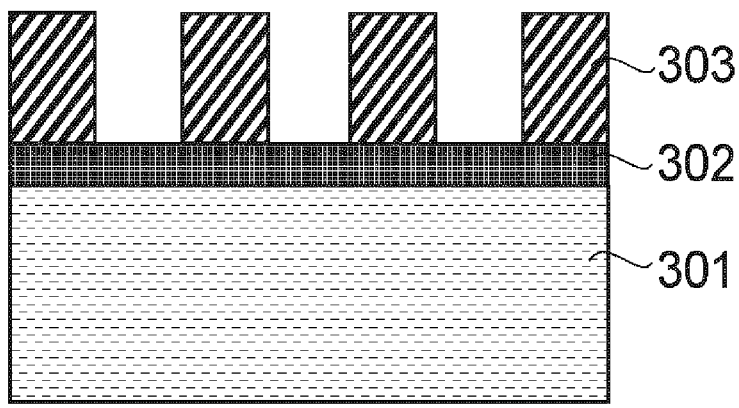
FIGS. 3(a) to 3(c) are sectional views for illustrating a pattern forming method in Document 2.
Figure 3:
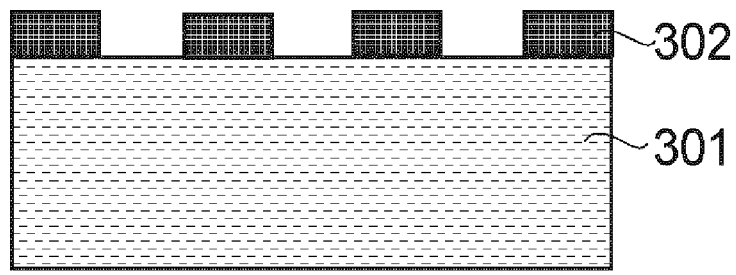
Figure 3:
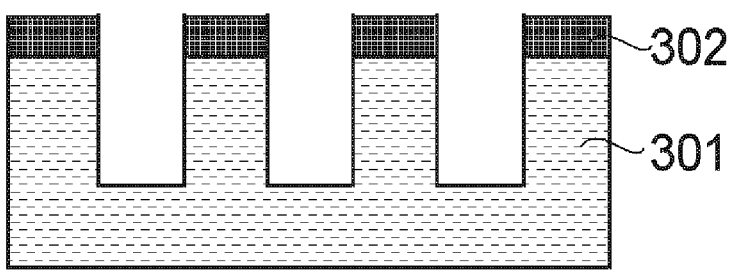
Figure 4:
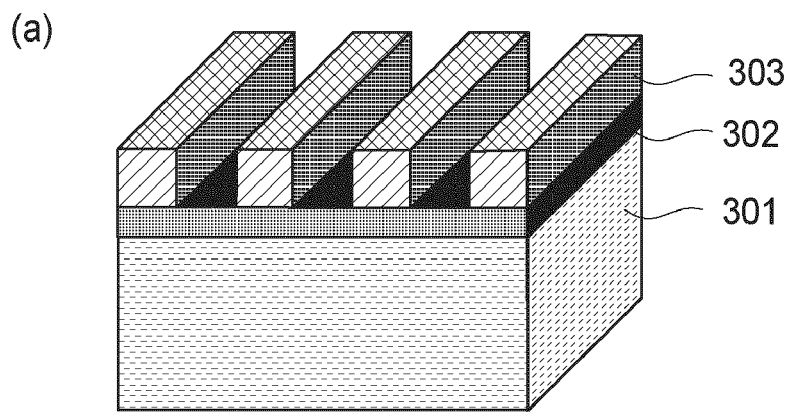
FIGS. 4(a) to 4(c) are perspective views for illustrating a problem in a conventional imprint technology.
Figure 4:
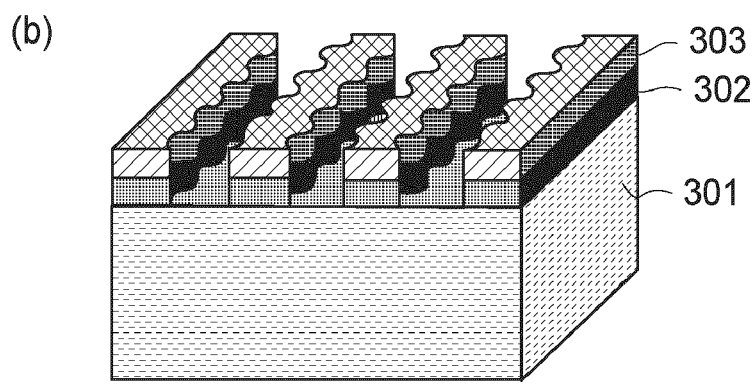
Figure 4:
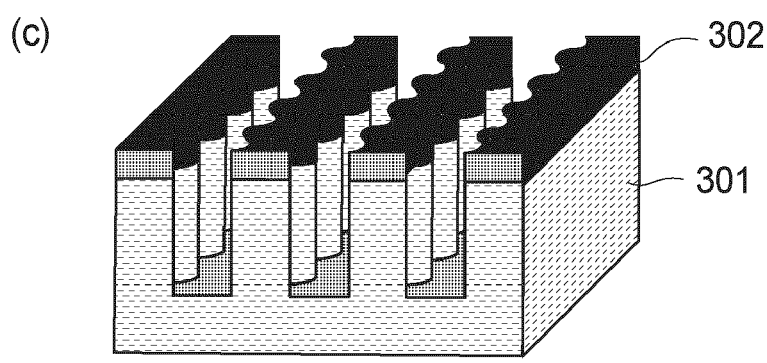
Figure 5:
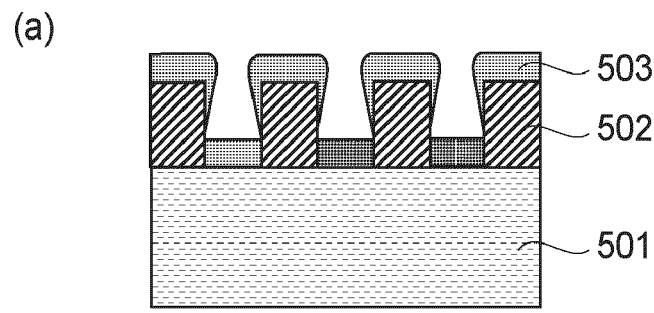
FIGS. 5(a) and 5(b) are schematic views for illustrating a pattern forming method in Document 3.
Figure 5:
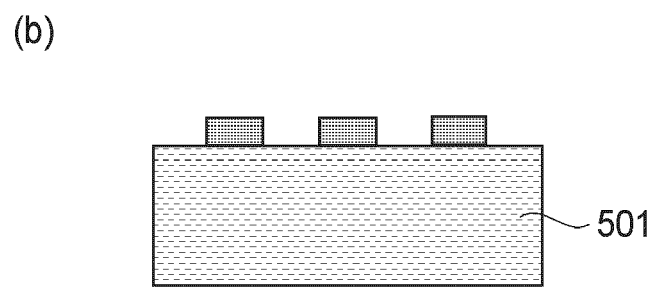
Figure 6:
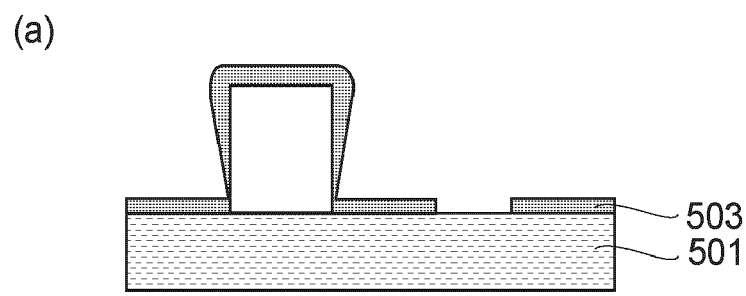
FIGS. 6(a) to 6(c) are perspective views for illustrating problems in a conventional lift-off method.
Figure 6:
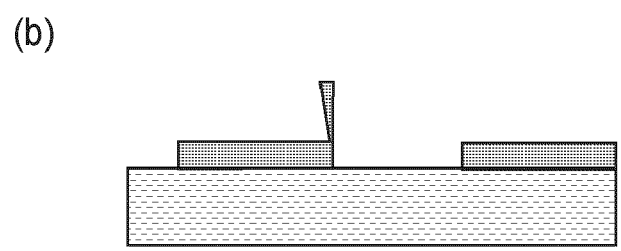
Figure 6:
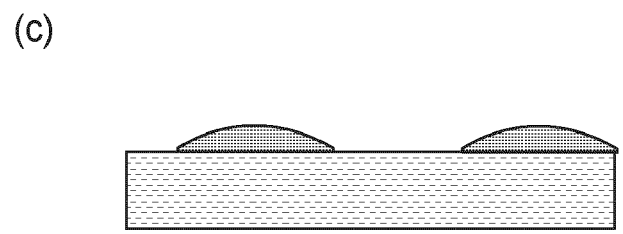

Next, on the thin film 102 for forming the hard mask, a transfer layer 201 is formed and thereon the resist pattern 103 is formed (FIG. 2(a)).

(2) Step of Forming a First Reverse Layer of a Third Material on the Resist Pattern On the resist pattern 103, a first reverse layer 202 is formed of the third material (FIG. 2(b)).

(3) Step of Forming a First Reverse Pattern of the First Reverse Layer Complementary to the Resist Pattern by Removing the Resist after Removing the First Reverse Layer Until the Surface of the Resist is Exposed.

First, the reverse layer 202 is processed and removed until an upper surface of the resist 103 is exposed. Thereafter, the resist 103 is removed to form a reverse pattern layer 203 in a manner that opening portions of the pattern of the resist 103 are replaced with the first reverse layer 202 (FIG. 2(c)). The process in this step is performed in the same manner as in Steps (3) and (4) described above with reference to FIGS. 1(c) and 1(d). Incidentally, after the step of forming the first reverse layer, it is also possible to perform a step of flattening the first reverse layer.

(4) Step of Forming a Second Reverse Pattern Comprising the Transfer Layer and the First Reverse Pattern Formed on the Transfer Layer by Etching the Transfer Layer Through the First Reverse Layer as a Mask With the reverse pattern layer 203 as the mask, the transfer layer 201 is etched to form a second reverse pattern 204 comprising the transfer layer 201 and the reverse pattern layer 203 disposed on the transfer layer 201 (FIG. 2(d)).

(5) Step of Forming a Second Reverse Layer of the Third Material on the Second Reverse Pattern On the reverse pattern 204, a second reverse layer 205 is formed (FIG. 2(e)).

(6) Step of Removing the Second Reverse Layer and the First Reverse Pattern Until the Surface of the Transfer Layer is Exposed The second reverse layer 205 and the first reverse pattern 203 are processed and removed until an upper surface of the transfer layer 201 is exposed (FIG. 2(f)). Incidentally, after the step of forming the second reverse layer, a step of flattening the second reverse layer may also be performed.

(7) Step of Forming a Third Reverse Layer, of the Second Reverse Layer, Complementary to the First Reverse Pattern by Removing the Transfer Layer after the Above Step (6)

A third reverse pattern 206 is formed by removing the transfer layer 201 (FIG. 2(g)).

The removal of the transfer layer 201 is performed by etching/ashing using a parting (releasing) liquid or plasma.

(8) Step of Forming a Hard Mask Layer Comprising the Thin Film, on which the Third Reverse Pattern is Formed, by Etching the Thin Film Through the Third Reverse Pattern as a Mask The hard mask layer is formed by etching the thin film 102 for forming the hard mask through the third reverse pattern 206 as a mask (FIG. 2(h)).

(9) Step of Etching the Base Material of the First Material Through, as a Mask, the Hard Mask Layer of the Thin Film on which the Third Reverse Pattern Remains or the Hard Mask Layer on which the Third Reverse Pattern has been Removed.

By using a combination of the third reverse pattern 206 and the hard mask 102 as the mask or using the hard mask 102 on which the third reverse pattern 206 has been removed as the mask, the base material 101 is etched (FIG. 2(i)). After the etching, the third reverse pattern 206 and/or the hard mask layer 102 may be removed as desired.

In the case of using the above pattern forming method, the resist pattern 103 and the third reverse pattern 206 coincide with each other in cross-sectional shape (projection/recess arrangement). That is, by using properly the processes shown in FIGS. 1(a) to 1(f) and FIGS. 2(a) to 2(i), it is possible to form either of the reverse pattern 105 (of FIG. 1(d)) complementary to the resist pattern 103 and the reverse pattern 206 (of FIG. 2(g) corresponding to the resist pattern 103, from a single drawing pattern (the resist pattern 103).

Further, by selecting the pattern forming method shown in FIGS. 2(a) to 2(i), it is possible to form a pattern having a small drawing area.

As the material for the transfer layer 201, the material may desirably be selected from materials which are not developed by drawing with the resist and are organic materials containing components which are relatively close to the component of the resist.

For example, the material for the transfer layer 201 may suitably include a reflection preventing film (bottom anti-reflection coating (BARC)), spin on carbon (SOC), diamond-like carbon (DLC), etc. In the case of using such materials, the removal of the resist 103 (FIG. 2(c)) and the etching of the transfer layer 201 (FIG. 2(d)) can be performed in a similar etch condition, so that it is also possible to continuously perform the removal and the etching in a single step.

By the above-described pattern forming methods, it is possible to prepare an ordinary fine pattern. Further, by applying the pattern forming methods to preparation of a mold for nanoimprint, it is possible to realize a processing apparatus, a processing method, and a structure processed by the processing method, in which a pattern is imprinted onto a member to be processed by using the mold.

By the above-described pattern forming method, it is possible to prepare a general fine pattern but the pattern forming method is also applicable to preparation of the mold for nanoimprint. By the resultant mold, it is possible to provide a processing apparatus and a processing method which are configured to imprint a pattern onto a member to be processed and to provide a structure processed by the processing method.

Figure 8:
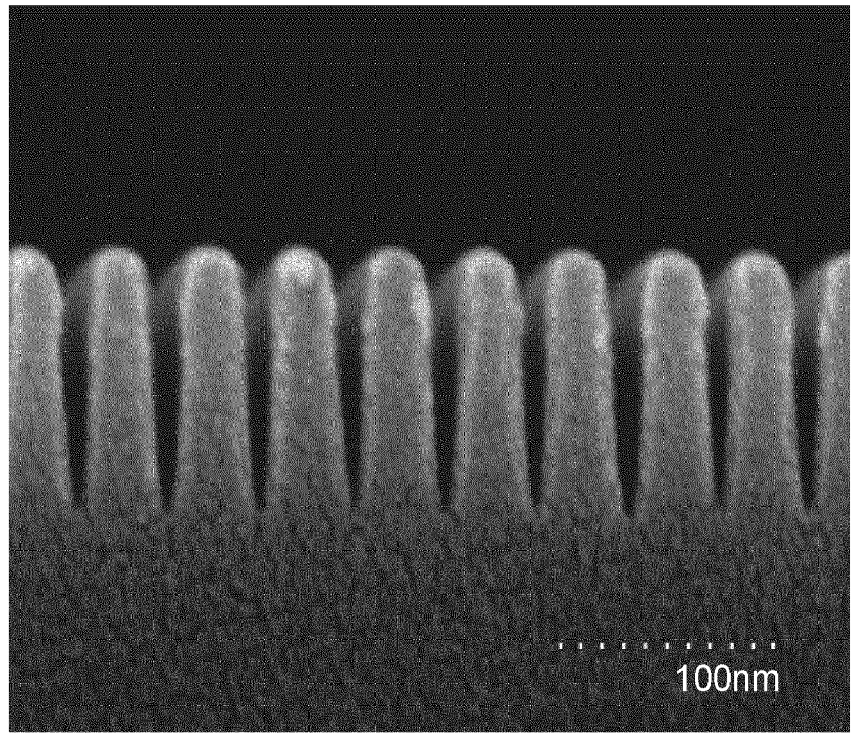
FIG. 8 is a sectional photographic image of a pattern formed by a pattern forming method in an embodiment of the present invention.
Figure 9:
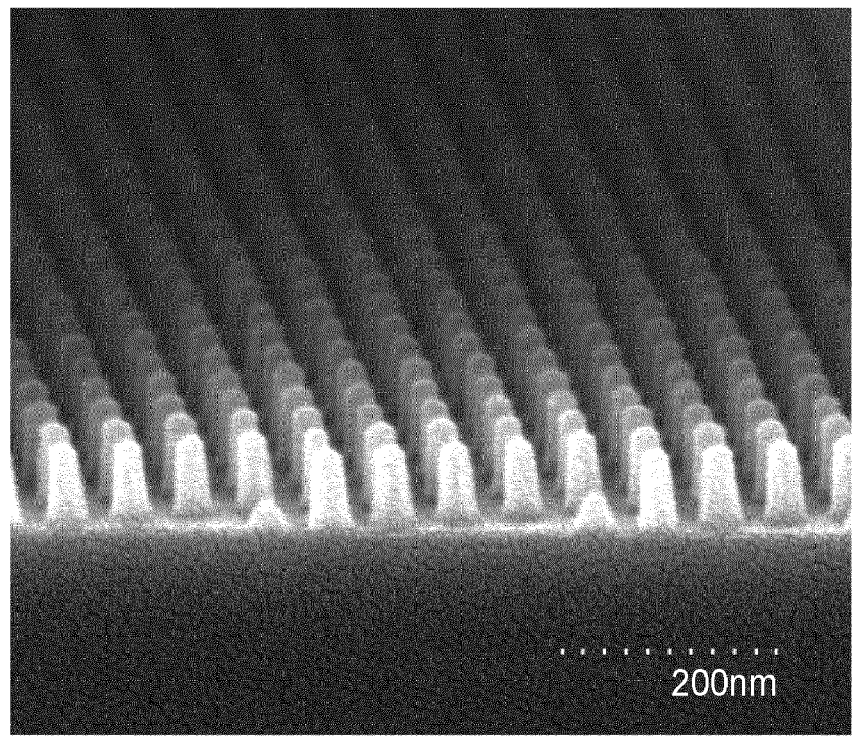
FIG. 9 is a perspective photographic image of a pattern formed by a pattern forming method in an embodiment of the present invention.

Further, by the pattern forming methods described above, it is possible to easily prepare a line-and-space pattern having a half pitch (hp) of 22 nm or less, a side wall angle of 87.5 degrees or more, and an aspect ratio of 4.5 or more as shown in FIG. 8. Further, it is possible to easily prepare a dot pattern having a half pitch (hp) of 32 nm or less, a side wall angle of 84 degrees or more, and an aspect ratio of 2.0 or more as shown in FIG. 9.

These patterns are formed by using, e.g., quartz as the base material of the first material, a 10 nm-thick layer of chromium (Cr) as the thin film of the second material for forming the hard mask, and SOG (silicon oxide compound) as the reverse layers.

In the above described pattern forming methods, the etching of the base material (quartz) is performed in a state in which the reverse layer (SOG) remains on the thin film (Cr) but the reverse layer is also etched simultaneously with the thin film in the etching process, so that the reverse layer doe not remain on a final structure.

The hard mask (Cr) may be left on the thin film as it is but it is desirable that the hard mask is removed in the case where the resultant mask is used as a mask for optical imprint.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 137234/2007 filed May 23, 2007, which is hereby incorporated by reference.

What is claimed is:

1. A pattern forming method comprising:
  a step of forming a pattern of a resist on a transfer layer provided on a thin film, provided on a surface of a base material of a first material, of a second material;
  a step of forming a first reverse layer of a third material on the pattern of the resist;
  a step of forming a first reverse pattern, of the first reverse layer complementary to the pattern of the resist by removing the resist after removing the reverse layer to expose a surface of the resist;
  a step of forming a second reverse pattern comprising the transfer layer and the first reverse pattern formed on the transfer layer by etching the transfer layer using the first reverse pattern as a mask;
  a step of forming a second reverse layer of the third material on the second reverse pattern;
  a step of forming a third reverse pattern, of a second reverse layer, complementary to the first reverse pattern by removing the transfer layer after removing the second reverse layer and the first reverse pattern to expose a surface of the transfer layer;
  a step of forming a hard mask layer comprising the thin film, on which the third reverse pattern is formed, by etching the thin film using the third reverse pattern as a mask; and
  a step of etching the base material using, as a mask, the hard mask layer on which the third reverse pattern remains or the hard mask layer on which the third reverse pattern has been removed.

2. A method according to claim 1, wherein in said step of etching the base material, an area other than an area in which the hard mask layer is used as the mask is less than 50% of an area of an entire surface of the base material.

3. A method according to claim 1, wherein said pattern forming method further comprises a step of flattening the first reverse layer after said step of forming the first reverse layer.

4. A method according to claim 1, wherein said pattern forming method further comprises a step of flattening the second reverse layer after said step of forming the second reverse layer.

5. A method according to claim 1, wherein the reverse layer is formed of a material having a resistance to plasma higher than the resist.

6. A method according to claim 1, wherein the first material is silicon oxide, the second material is chromium, and the third material is a spin on glass containing silicon oxide.

7. A method according to Claim 1, wherein said pattern forming method forms a line and space pattern having a half pitch of 22 nm or less, a side wall angle of 87.5 degrees or more, and an aspect ratio of 2.0 or more.

8. A method according to Claim 1, wherein said pattern forming method forms a dot pattern having a half pitch of 32 nm or less, a side wall angle of 84 degrees or more, and an aspect ratio of 2.0 or more.

* * * * *